US007573272B2

(12) United States Patent
Becker et al.

(10) Patent No.: US 7,573,272 B2
(45) Date of Patent: Aug. 11, 2009

(54) ANTENNA RECONFIGURATION VERIFICATION AND VALIDATION

(75) Inventors: Robert C. Becker, Eden Prairie, MN (US); David W. Meyers, Brooklyn Park, MN (US); Kelly P. Muldoon, Minneapolis, MN (US); Douglas R. Carlson, Woodbury, MN (US); Jerome P. Drexler, Wyoming, MN (US)

(73) Assignee: Honeywell International Inc., Morristown, NJ (US)

( * ) Notice: Subject to any disclaimer, the term of this patent is extended or adjusted under 35 U.S.C. 154(b) by 484 days.

(21) Appl. No.: 11/343,006

(22) Filed: Jan. 30, 2006

(65) Prior Publication Data

US 2007/0180338 A1 Aug. 2, 2007

(51) Int. Cl.
*G01R 31/04* (2006.01)

(52) U.S. Cl. ....................... 324/538; 324/754; 342/174; 342/368; 398/87; 398/198

(58) Field of Classification Search .................. 324/538
See application file for complete search history.

(56) References Cited

U.S. PATENT DOCUMENTS

| | | | | |
|---|---|---|---|---|
| 4,270,178 A * | 5/1981 | Lillig | 702/116 |
| 4,390,837 A * | 6/1983 | Hotvedt | 324/754 |
| 5,731,790 A * | 3/1998 | Riza | 342/368 |
| 6,208,287 B1 * | 3/2001 | Sikina et al. | 342/174 |
| 6,252,542 B1 * | 6/2001 | Sikina et al. | 342/174 |
| 6,944,437 B2 * | 9/2005 | Yang et al. | 455/323 |
| 6,992,638 B2 * | 1/2006 | du Toit et al. | 343/776 |
| 2002/0181874 A1 | 12/2002 | Tulchinsky et al. | |
| 2004/0022541 A1 * | 2/2004 | Stephens | 398/87 |
| 2007/0280704 A1 * | 12/2007 | Fitzgerald et al. | 398/198 |

FOREIGN PATENT DOCUMENTS

DE 19942038 10/2000

OTHER PUBLICATIONS

Oh, Sung-Hoon and Aberle, James T., Reconfigurable Antennas as an Enabling Technology for SDR, Proceeding of the SDR 04 Technical Conference and Product Exposition. Copyright 2004 SDR Forum.*

Agilent 4075 Advanced and 4076 Ultra Advanced DC/RF/Pulse Parametric Testers Product Overview/Data Sheet, Agilent Technologies, Inc, Mar. 3, 2005.*

* cited by examiner

*Primary Examiner*—Vincent Q Nguyen
*Assistant Examiner*—Benjamin M Baldridge
(74) *Attorney, Agent, or Firm*—Black Lowe & Graham PLLC

(57) ABSTRACT

A method of testing the electrical functionality of an optically controlled switch in a reconfigurable antenna is provided. The method includes configuring one or more conductive paths between one or more feed points and one or more test point with switches in the reconfigurable antenna. Applying one or more test signals to the one or more feed points. Monitoring the one or more test points in response to the one or more test signals and determining the functionality of the switch based upon the monitoring of the one or more test points.

20 Claims, 8 Drawing Sheets

ANTENNA RECONFIGURATION VERIFICATION AND VALIDATION

GOVERNMENT LICENSE RIGHTS

The U.S. Government may have certain rights in the present invention as provided for by the terms of Government Contract # R-700-200451-20053/NASA: NNC04AA44A awarded by the Ohio Aerospace Institute/NASA GLENN.

CROSS REFERENCE TO RELATED CASE

This application is related to U.S. patent application Ser. No. 11/253,188 (herein referred to as the '188 application), filed on Oct. 18, 2005, with a title "Low Power for Antenna Reconfiguration", which is incorporated herein by reference in its entirety.

BACKGROUND

Passive antennas cannot be steered or reconfigured except by physical reorientation and the use of an external antenna tuner to change frequencies. Electrically reconfigurable antenna technology is currently under development. This technology allows a fixed position antenna to electronically steer the radio wave beam in a desired direction and change frequency configuration. One means currently used to reconfigure steerable antennas is optically coupled switches. In the related '188 application, a reconfigurable antenna using low power controlled switching and configuration state techniques is described. In the embodiments described in the '188 application, switches controlling paths in an antenna array are controlled optically via optical drivers. Since the optical drivers are isolated from the electrical switches in the reconfigurable antenna in the '188 application, there is no feedback to confirm that for any given pattern, the array of optically isolated electrical switches have been actuated and are functioning correctly.

For the reasons stated above and for other reasons stated below which will become apparent to those skilled in the art upon reading and understanding the present specification, there is a need in the art for a method of effectively and efficiently testing the functionality or operation of the switches controlled optically via optical drivers in a reconfigurable antenna array.

SUMMARY

The Embodiments of the present invention provide methods and systems for testing the optically controlled switches in a reconfigurable antenna and will be understood by reading and studying the following specification.

In one embodiment, a method of testing the functionality of optically controlled switches in a reconfigurable antenna is provided. The method includes configuring a first conductive path between a feed point and a first test point. Applying a first test signal to the feed point and monitoring the first test point in response to the first test signal.

In another embodiment, another method of testing an optically controlled switch in a reconfigurable antenna is provided. The method includes configuring one or more conductive paths between one or more feed points and one or more test point with switches in the reconfigurable antenna. Applying one or more test signals to the one or more feed points. Monitoring the one or more test points in response to the one or more test signals and determining the functionality of the switch based upon the monitoring of the one or more test points.

In yet another embodiment, a tester for testing optically activated switches in a reconfigurable antenna is provided. The tester includes a switch control circuit, a test signal output circuit, a test circuit analyzer and a controller. The switch control circuit is adapted to manipulate the switches in the reconfigurable array to form select conductive paths between one or more feed points and one or more test points in the reconfigurable array. The test signal output circuit is adapted to output one or more test signals to the one or more feed points in the reconfigurable antenna. The test circuit analyzer is adapted to monitor the one or more test points in response to the one or more test signals and the controller is adapted to control the switch control circuit, the test signal output circuit and the test circuit analyzer.

In still another embodiment, a method of testing optically controlled switches in a reconfigurable array is provided. The method includes a means to manipulate the optically controlled switches to form at least one conductive path between at least one feed point and at least one test point. A means to provide at least one test signal to the at least one feed point. A means to monitor the at least one test point in response to the at least one test signal and a means to determine the functionality of at least one of the optically controlled switches based on the monitoring of the at least one test point.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide methods of testing optically controlled switches in a reconfigurable array. In particular, in embodiments of the present invention one or more feed points and test points are electrically connected to pad elements in the reconfigurable array. Test signals are sent through the feed points to the test points via conductive paths selectively created by opening and closing the switches. The functionality of the switches are then determined by monitoring the test signals at the test points.

Figure 1:
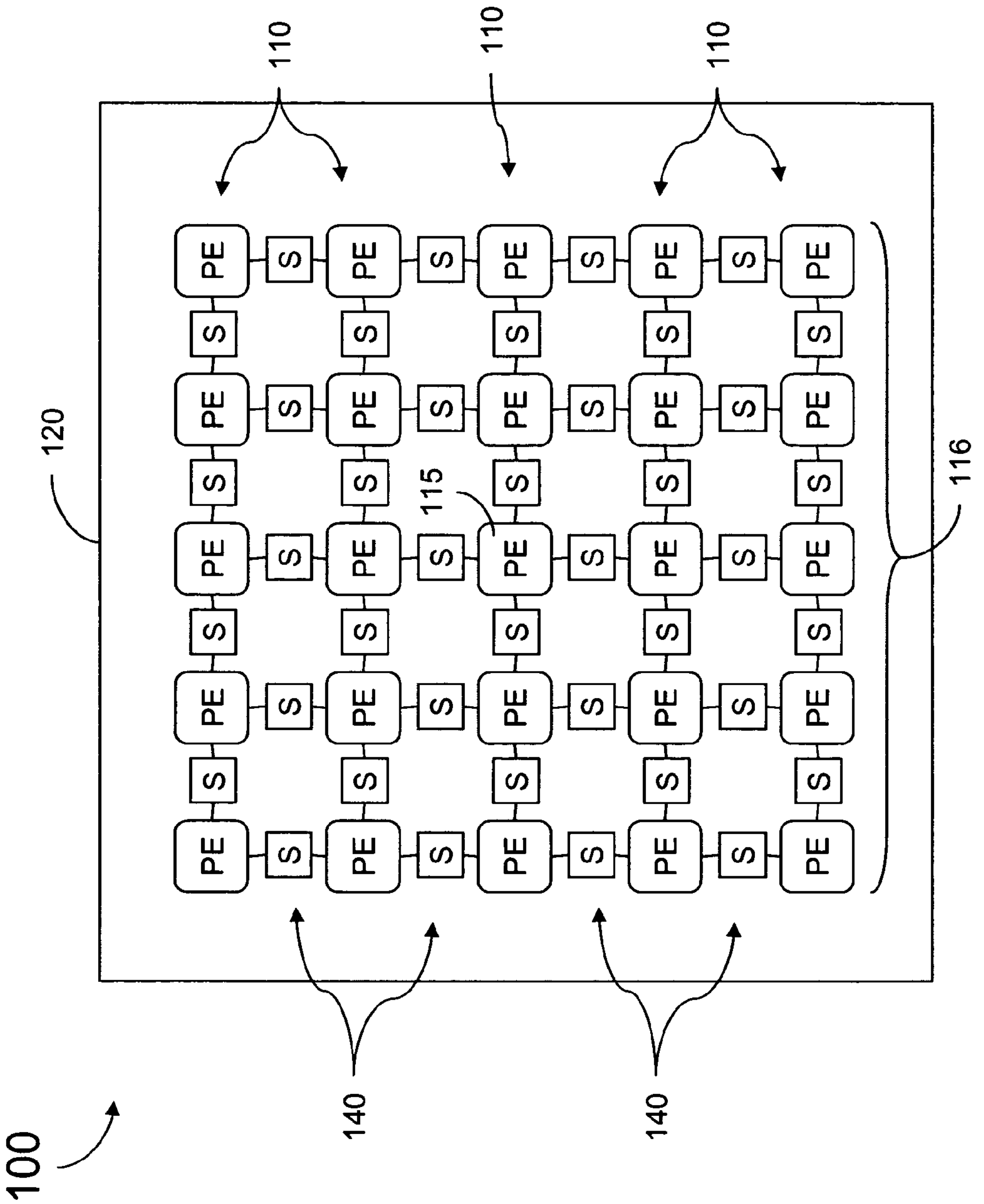
FIG. 1 is a diagram illustrating a reconfigurable antenna array.
Figure 2:
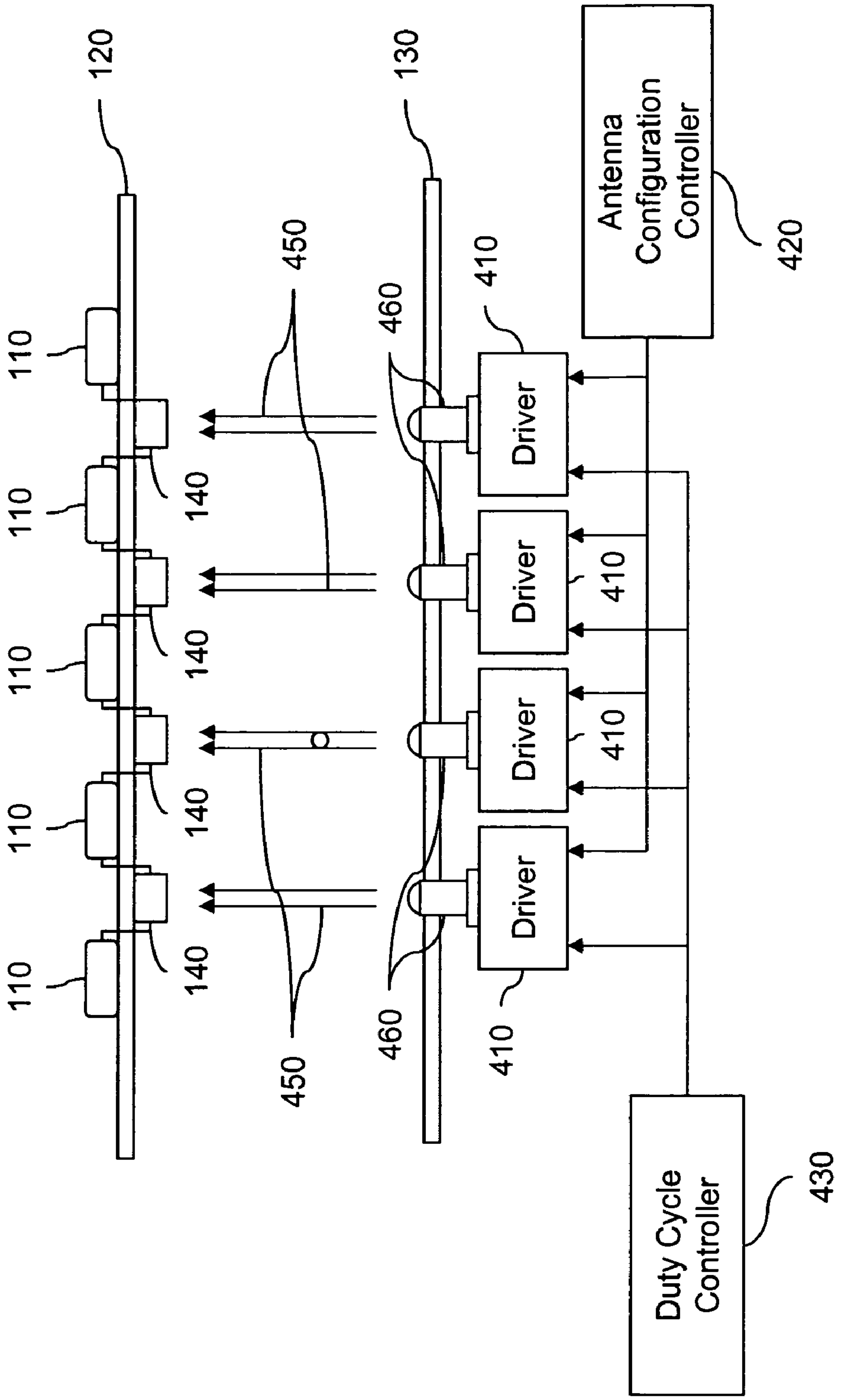
FIG. 2 is a diagram illustrating a reconfigurable antenna array.

To provide further background, FIG. 1 illustrates a reconfigurable antenna aperture (or reconfigurable antenna array) 100 of one embodiment of the invention in the '188 application. Reconfigurable antenna array 100 comprises a matrix of metallic pad elements (PE) 110 arranged in an array 116. In one embodiment, pad elements 110 are mounted onto a printed circuit board 120. The printed circuit board 120 is suspended over a ground plane 130 to form an antenna, as illustrated in FIG. 2. Aperture 100 further comprises a plurality of switches (S) 140 which function to couple or decouple neighboring pad elements 110 together.

In operation, in one embodiment, one of the pad elements 110, such as center element 115, is driven by an electrical signal. By opening and closing one or more of switches 140 the pattern in which current flows from center element 115 through pad elements 110 of reconfigurable antenna array 100 can be reconfigured, enabling the ability to reconfigure the resulting radiation pattern from reconfigurable antenna array 100. The pattern of current flow can thusly be reconfigured to create antenna array patterns, such as but not limited to a bent wire pattern and a spiral pattern, each with known radiation patterns. As illustrated in FIG. 2, switches 140 are optically driven switches. One advantage of optically driven switches is that they avoid the need for additional control wires located near pad elements 110, which would tend to distort the radiation pattern of aperture 100.

The reconfigurable antenna array 100 of FIG. 2 further comprises a plurality of light sources 460 each controlled by an associated driver 410. In one embodiment, light sources 460 are each VCSELs such as, but not limited to the VCE-F85B20 manufactured by Lasermate Group, Inc. In one embodiment, light sources 460 are embedded into ground plane 130 and positioned to illuminate exactly one of switches 140. In one embodiment, each driver 410 controls one or more of light sources 460. In one embodiment drivers 410 are drivers such as, but not limited to the STP16CL596 manufactured by STMicroelectronics. In one embodiment, an antenna configuration controller 420 is coupled to communicate the desired antenna array pattern to drivers 410. In one embodiment, antenna configuration controller 420 is a TMS320c6711 digital microprocessor manufactured by Texas Instruments. In one embodiment, based on the communicated antenna array pattern, each driver will turn off one or more of switches 140 by turning on one or more of light sources 460. In one embodiment, a duty cycle controller 430 is also coupled to drivers 410 to communicate a duty cycle signal to each of drivers 410 for cycling light sources 460. For example, in one embodiment, duty cycle controller 430 is coupled to an output enable pin of an STP16CL596. In one embodiment, for each switch 140 which should be in an off state based on the antenna array pattern communicated from antenna configuration controller 420, drivers 410 will cycle the associated light sources 460 on (for time t1) and off (for time t0) as directed by duty cycle controller 430. In one embodiment, duty cycle controller 430 outputs a duty cycle signal comprising a square wave signal with a signal low for time t1 and a signal high for time t0. By duty cycling light signals 450 from light sources 460 based on t1 and t0, Vs within each of the switches 140 that need to remain off in order to establish the desired antenna array pattern will be maintained above Vmin.

Figure 3:
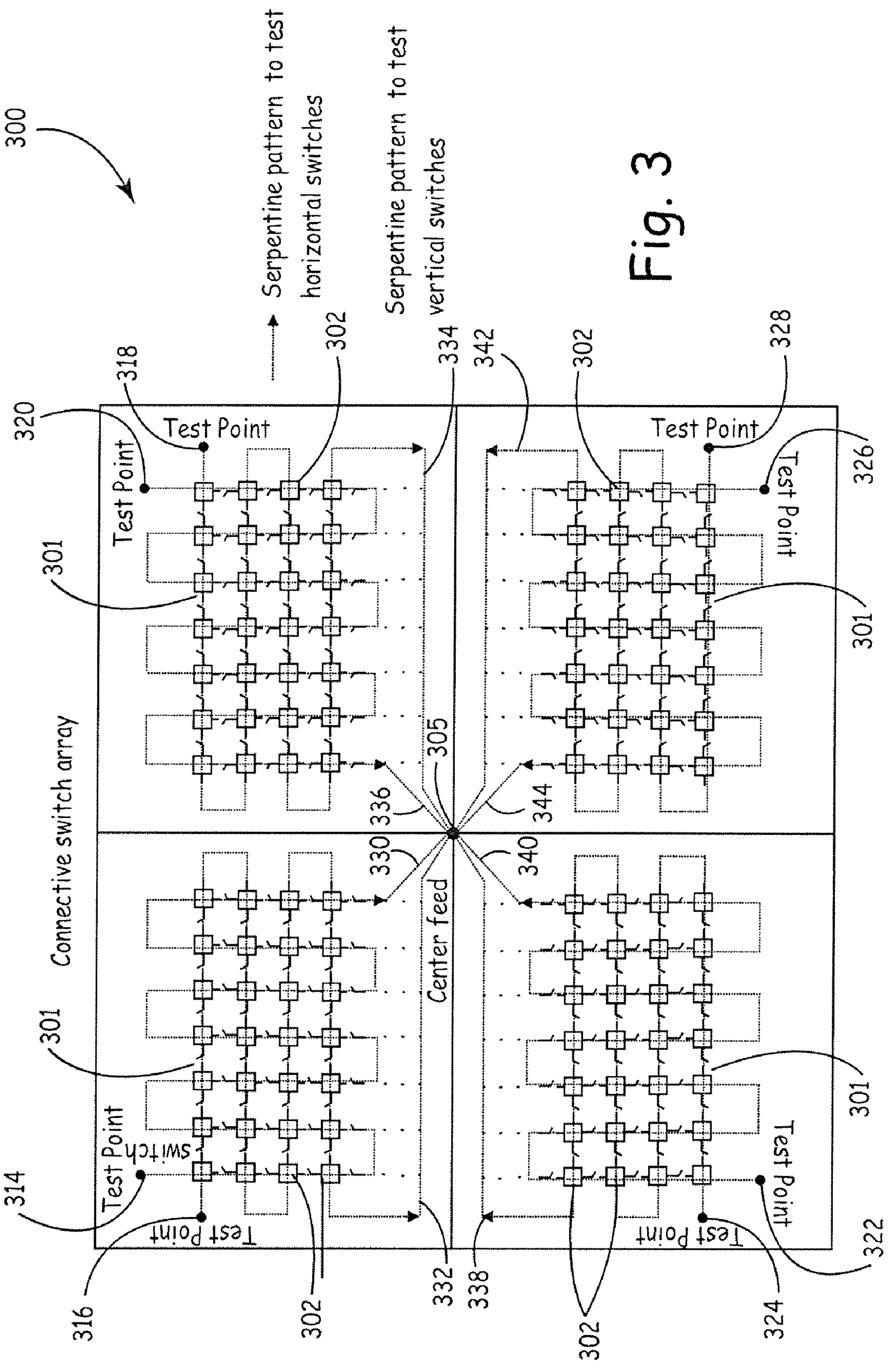
FIG. 3 is a diagram illustrating a reconfigurable antenna aperture having a center feed and test points of one embodiment of the present invention.

FIG. 3 illustrates a reconfigurable antenna array 300 of one embodiment of the present invention. As illustrated, the reconfigurable antenna array 300 includes a plurality of metallic pad elements 302 and a plurality of switches 301. As discussed above the switches 301 are designed to selectively provide conductive paths between metallic pad elements 302. As illustrated, in this embodiment, the metallic pad elements 302 are split into arrays in four different quadrants. A feed point 305 (which in this case is a center point 305) is selectively coupled to the metallic pad elements 302 in each of the four quadrants of elements. In addition, each quadrant in this embodiment includes a first and a second test point 314, 316, 318, 320, 322, 324, 326 and 328 respectively. In one embodiment, serpentine conductive paths 332, 330, 334, 336, 338, 340, 342 and 344 are selectively formed in each quadrant from the feed point 305 to a select test point 314, 316, 318, 320, 322, 324, 326 or 328. A test signal is then applied to the feed point 305. The select test point 314, 316, 318, 320, 322, 324, 326 or 328 is monitored to determine the functionality of the switches along the serpentine conductive path 332, 330, 334, 336, 338, 340, 342 or 344 based on a received test signal.

Figure 4:
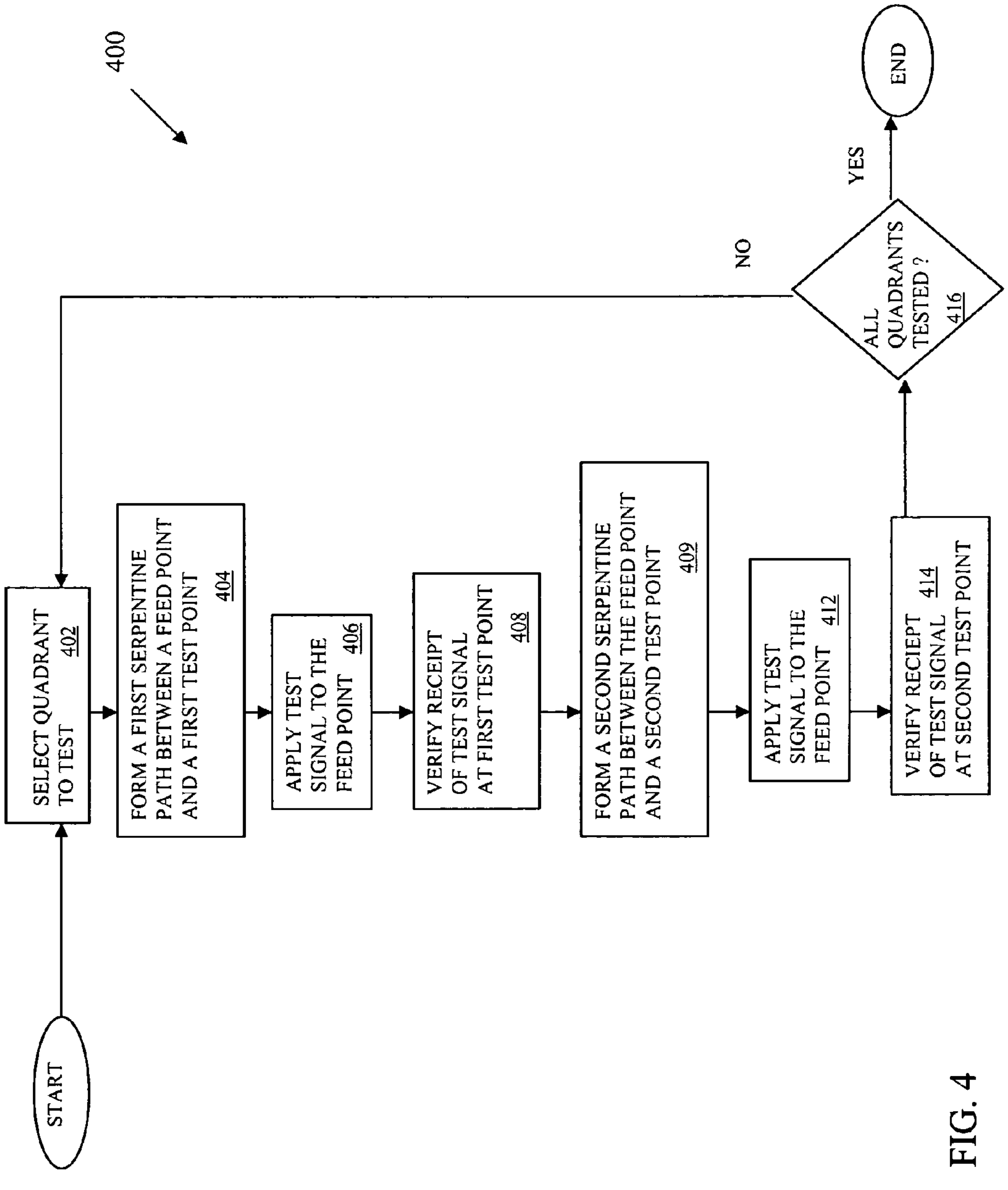
FIG. 4 is a flow diagram illustrating one method of testing switches in a reconfigurable array of one embodiment of the present invention.

Referring to FIG. 4, a flow diagram 400 illustrating the one method of testing the switches 301 in quadrants of the reconfigurable antenna array 300 of FIG. 3 is provided. The flow diagram 400 is described in relation to the quadrant including test points 314 and 316 of FIG. 3. As illustrated in FIG. 4, the method begins by selecting the quadrant to be tested (402). In this embodiment a first serpentine conductive path 330 between the feed point 305 and a first test point 314 is formed with the switches 301 (404). A test signal is then applied to the feed point 305 (406). The receipt of the test signal at the first test point 314 is then verified (408). A second serpentine conductive path 332 is formed between the feed point 105 and the second test point 316 (409). Another test signal is then applied to the feed point 305 (412). The receipt of this test signal at the second test point 316 is then verified (414). It is then determined if quadrants are to be tested (416). If other quadrants are to be tested (416), the process continues by selecting another quadrant (402). If another quadrant is not to be tested (416), the process ends.

Figure 5:
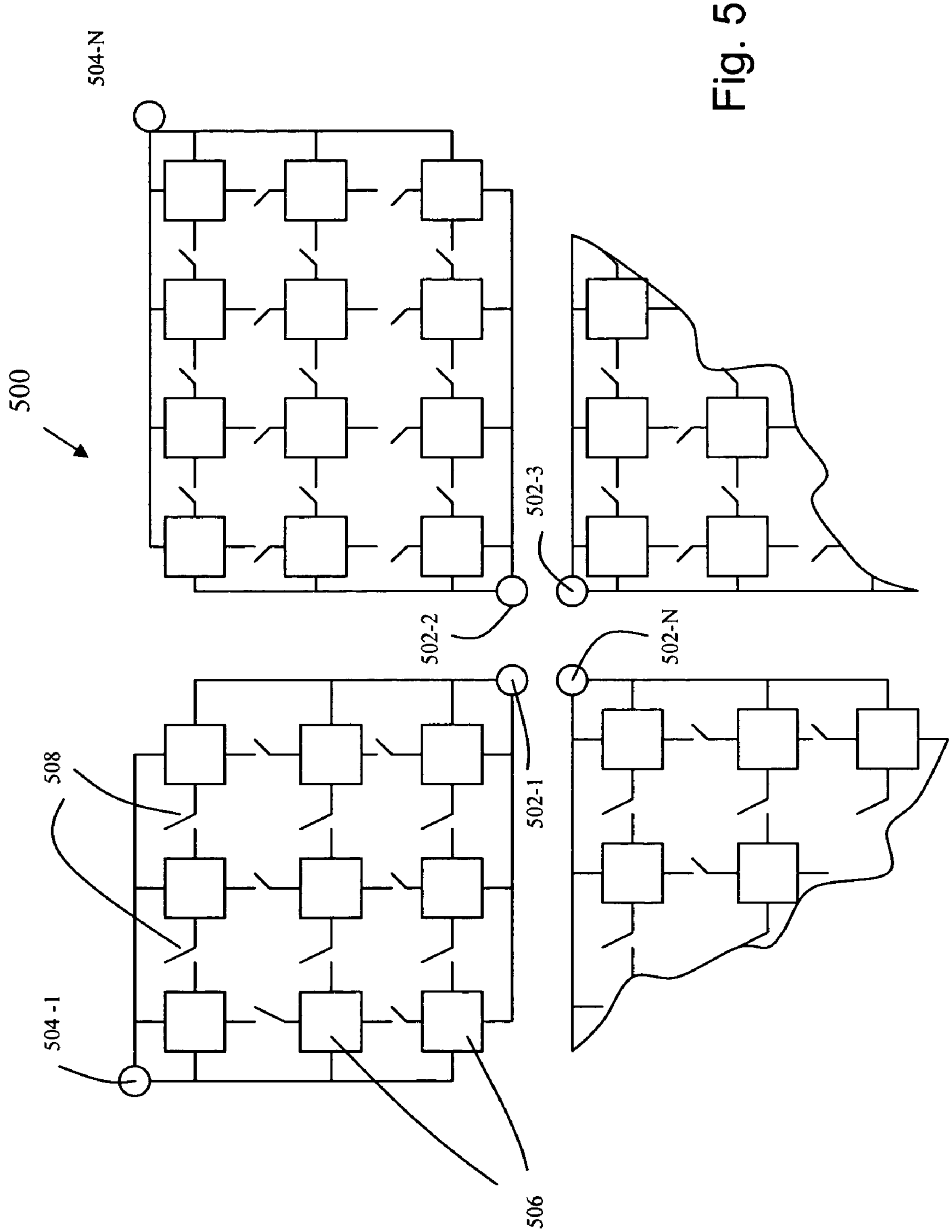
FIG. 5 is a diagram illustrating a reconfigurable antenna aperture having a plurality of center feeds and test points of one embodiment of the present invention.

FIG. 5 illustrates a portion of a reconfigurable antenna array 500 of another embodiment of the present invention. The reconfigurable antenna array 500 includes a plurality of switches 508 and pad elements 506. In this embodiment, a plurality of feed points 502-1 through 502-N and a plurality of test points 504-1 through 504-N are used. In this embodiment, individual switches 508 can be tested by selectively creating different conductive paths between associated feed points 502-1 through 502-N and test points 504-1 through 504-N and applying test signals to each of the paths. For example, if you wanted to verify that a switch was closing properly, you would activate the switch to create a path with the switch between the feed point 502 and the test point 504 and send a continuity test signal through the path. If the continuity test signal was not received at the test point 504, different paths would be created and tested until the performance of that particular switch can be isolated. The configuration of the reconfigurable array 500 of FIG. 5 is made by way of example and not by way of limitation. It will be understood in the art that other configurations including the number of feed points, test points and the placement of elements that make up the array may vary and that the present invention is not limited to a specific number of feed points, test points and the specific design of the array of pad elements.

Figure 6:
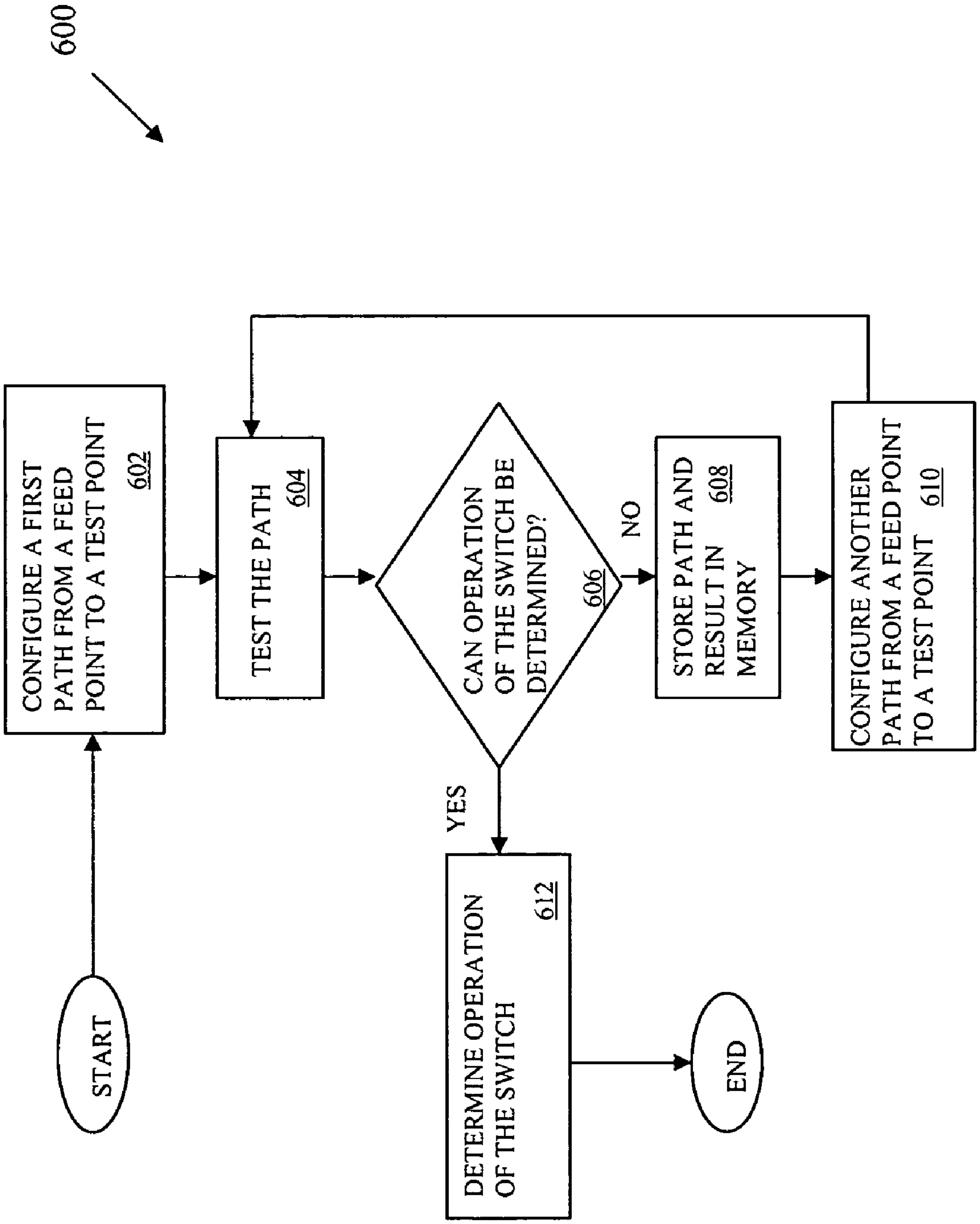
FIG. 6 is a flow diagram illustrating another method of testing switches in a reconfigurable array of one embodiment of the present invention.

Referring to FIG. 6, a flow diagram 600 of an example of a method of testing a switch in a reconfigurable antenna array 500 such as the array of FIG. 5 is illustrated. As illustrated in FIG. 6, the method starts by configuring a first path from a feed point to a test point (602). The path is then tested by applying a test signal at the feed point and monitoring the test point for a response to the test signal (604). It is then determined if the functionality of the switch can be determined (606). If the functionality of switch cannot be determined (i.e. cannot be isolated) (608), information regarding the path and the result associated with the path is then stored in memory (606). Then another different path is configured from a feed point to a test point (610). The different path may be from the same feed point to the same test point or from different feed point to different test point or any combination thereof. This path is then tested (604). The path and the result of the test of this path are compared with the stored path information and associated result(s) to determine if the functionality of switch can be determined (606). If the functionality of the switch can be determined (608), it is determined and reported at (612). Otherwise the process continues at step (608).

Figure 7:
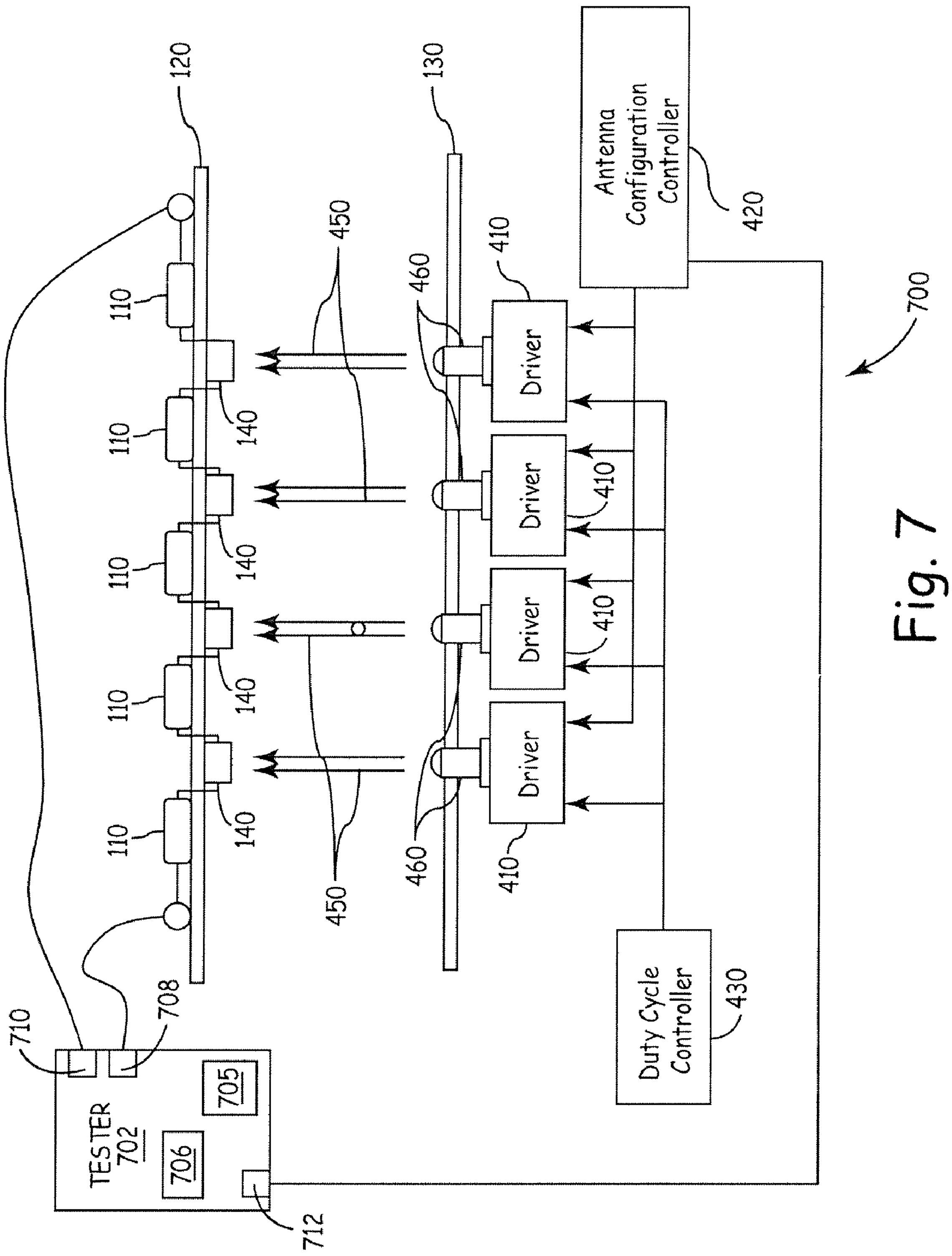
FIG. 7 is a block diagram of a testing system of one embodiment of the present invention.

In FIG. 7, an example of a test system 700 of one embodiment of the present invention is provided. The test system 700 includes a tester 702. The tester 702 includes a test signal output circuit 708 designed to apply a test signal to a feed point 704 and a test signal analyzer 710 designed to monitor a test point 707 in response to a test signal. The tester 702 further includes a switch controller circuit 712 that is designed to direct the antenna configuration controller 420 to activate select switches to create conductive paths between feed points and test points. The tester further includes a memory 705 to store results form the test signals on selects paths. In addition, the tester includes a controller 706 designed to process the results of the test signals and control the test signal output circuit 708, the test signal analyzer 710, the memory 705 and the switch controller circuit 712. Although each of the elements of the test system 700 are illustrated in FIG. 7 as being housed in a single test system 700, it will be understood that any or all of the elements could be separate stand alone devices and the present invention is not limited to a single system.

Figure 8:
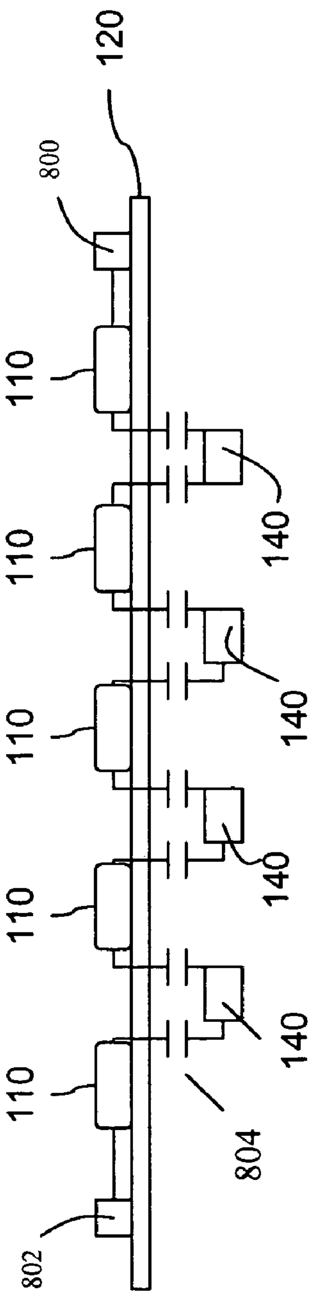
FIG. 8 is an illustration of switches and pad elements in one embodiment of the present invention.
Figure 9:
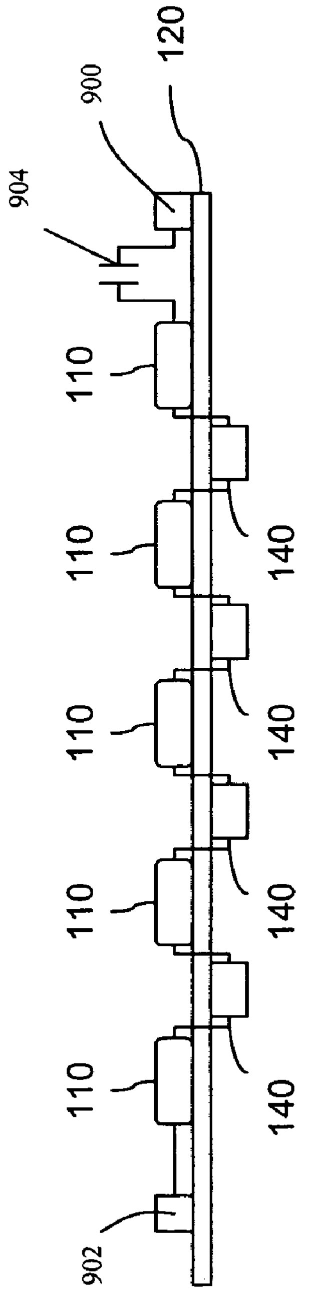
FIG. 9 is an illustration of switches and pad elements in one embodiment of the present invention.

The discussion of the test signal being a continuity test signal is made by way of example and not by limitation. Other test signals are contemplated and the present is not limited to continuity test signals. Regarding continuity testing, the switches can be tested for closing as well as opening properly. Moreover, continuity test signals used may be direct current (DC) or alternating current (AC) continuity test signals. In embodiments that use AC test signals, a capacitor or capacitors are incorporated in path between feed points and test points. For example, referring FIG. 8, in this embodiment, capacitors 804 are positioned between switches 140 and the pad antenna elements 110. Also illustrated in FIG. 8 is feed point 802 and test point 800. In another embodiment, as illustrated in FIG. 9, a capacitor 904 is positioned between a feed point 902 and a test point 900.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of testing the functionality of optically controlled switches in a reconfigurable antenna defined by an array of switches and pad antenna elements, the method comprising:

closing a first plurality of selected switches from the array of switches to configure a first conductive path between a feed point and a first test point, wherein the first conductive path is defined by the first plurality of selected switches and pad antenna elements;

applying a first test signal to the feed point;

monitoring the first test point for the first test signal; and determining that the first plurality of selected switches have operated in response to receiving the first test signal at the first test point.

2. The method of claim 1, further comprising:

closing a second plurality of selected switches from the array of switches to configure a second conductive path between the feed point and a second test point, wherein the second conductive path is defined by the second plurality of selected switches and pad antenna elements, and wherein at least one switch of the second plurality of selected switches is different from at least one switch of the first plurality of selected switches;

applying a second test signal to the feed point;

monitoring the second test point for the second test signal; and determining that the second plurality of selected switches have operated in response to receiving the second test signal at the second test point.

3. The method of claim 1, wherein the first and second conductive paths are serpentine paths through the array of switches and pad antenna elements.

4. The method of claim 1, further comprising:

separating the reconfigurable antenna into quadrants.

5. The method of claim 4, further comprising:

testing the switches in each quadrant separately.

6. The method of claim 1, wherein the first and second test signals are one of direct current continuity signals and alternating current continuity signals.

7. A method of testing an optically controlled switch in a reconfigurable antenna, the method comprising:

closing a plurality of selected switches from an array of switches to configure a plurality of conductive paths between one or more feed points and one or more test points with the controlled switch as a member of each of the conductive paths;

applying one or more test signals to each of the configured conductive paths;

monitoring the one or more test points for receipt of the one or more test signals; and determining that the controlled switch has properly closed in response to receiving the test signals for each of the conductive paths.

8. The method of claim 7, wherein the configuring of the one or more conductive paths isolates the controlled switch by including the optically controlled switch in each of the conductive paths.

9. The method of claim 7, further comprising:

storing path information and the results of the monitoring of the one or more test points associated with the conductive path information in a memory.

10. The method of claim 7, wherein determining the functionality of the switch further comprises:

comparing and analyzing results of the monitoring of test points associated with different conductive paths to isolate the functionality of the switch.

11. The method of claim 7, wherein the one or more test signals are at least one of direct current continuity signals and alternating current continuity signals.

12. A tester for testing optically activated switches in a reconfigurable antenna, the tester comprising:

a switch control circuit to manipulate a plurality of selected optically switches in the reconfigurable array to form a conductive path between a feed point and a test point in the reconfigurable array;

a test signal output circuit to output one or more test signals to the feed point in the reconfigurable antenna;

a test circuit analyzer to monitor the one or more test points for the one or more test signals; and a controller to control the switch control circuit, the test signal output circuit and the test circuit analyzer, and to identify an inoperable optically activated switch when the inoperable optically activated switch is an only common member of a plurality of optically activated switches of each of a plurality of tested conductive paths.

13. The tester of claim 12, further comprising:

a memory to store conductive path information and associated results of the monitoring of the one or more test points.

14. The tester of claim 12, wherein the controller processes results of the monitoring of the one or more test points to determine the functionality of one or more of the optically activated switches.

15. The tester of claim 12, wherein the switch control circuit is further in communication with the configuration controller to direct the configuration controller to manipulate the optically activated switches in the reconfigurable array.

16. The tester of claim 12, wherein the test signal output circuit outputs one of direct current continuity signals and alternating current continuity signals.

17. A system for testing optically controlled switches in a reconfigurable antenna, the system comprising:

a means to manipulate the optically controlled switches to form at least one conductive path between at least one feed point and at least one test point;

a means to provide at least one test signal to the at least one feed point;

a means to monitor the at least one test point in response to the at least one test signal; and a means to determine the functionality of at least one of the optically controlled switches based on the monitoring of the at least one test point.

18. The method of claim 1, wherein the switches are coupled between adjacent pad antenna elements.

19. The method of claim 2, further comprising:

determining that at least one of the first plurality of selected switches are inoperable in response to failing to receive the first test signal at the first test point;

determining that at least one of the second plurality of selected switches are inoperable in response to failing to receive the second test signal at the second test point;

comparing the first plurality of selected switches with the second plurality of selected switches to identify at least one switch that is a member of the first plurality of selected switches and the second plurality of selected switches; and determining that the at least one identified switch that is a member of the first plurality of selected switches and the second plurality of selected switches is an inoperable switch.

20. The method of claim 7, further comprising:

determining that the optically controlled switch is inoperable in response to failing to receive the test signal at at least two of the conductive paths, wherein only the optically controlled switch is a common member of the conductive paths.

* * * * *